(12) United States Patent
Kigure et al.

(10) Patent No.: US 10,324,106 B2
(45) Date of Patent: Jun. 18, 2019

(54) PHYSICAL QUANTITY SENSOR, ELECTRONIC DEVICE, AND MOBILE BODY

(71) Applicant: Seiko Epson Corporation, Tokyo (JP)

(72) Inventors: Shota Kigure, Takasaki (JP); Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 252 days.

(21) Appl. No.: 15/187,953

(22) Filed: Jun. 21, 2016

(65) Prior Publication Data

US 2017/0010295 A1 Jan. 12, 2017

(30) Foreign Application Priority Data

Jul. 10, 2015 (JP) ................................. 2015-138779

(51) Int. Cl.
*G01P 1/00* (2006.01)
*G01P 15/08* (2006.01)
*G01P 15/125* (2006.01)

(52) U.S. Cl.
CPC .... *G01P 15/125* (2013.01); *B81B 2201/0235* (2013.01); *B81B 2203/051* (2013.01); *G01P 2015/0814* (2013.01)

(58) Field of Classification Search
CPC .......... G01P 15/125; G01P 2015/0814; B81B 2201/0235; B81B 2203/051
USPC ........................................................ 73/497
See application file for complete search history.

(56) References Cited

U.S. PATENT DOCUMENTS

| | | |
|---|---|---|
| 5,983,721 A | 11/1999 | Sulzberger et al. |
| 6,065,341 A | 5/2000 | Ishio et al. |
| 8,207,586 B2 | 6/2012 | Sato et al. |
| 8,516,890 B2 | 8/2013 | Rehle |
| 9,279,825 B2 | 3/2016 | Rytkonen et al. |
| 9,316,666 B2 | 4/2016 | Suzuki |
| 9,651,574 B2 | 5/2017 | Rytkonen et al. |
| 9,791,472 B2 | 10/2017 | Sakai et al. |
| 2006/0032310 A1* | 2/2006 | Merassi ................ B81B 7/0048 73/514.35 |
| 2009/0282914 A1 | 11/2009 | Rehle |
| 2009/0314085 A1* | 12/2009 | Stahl ..................... G01P 15/125 73/514.32 |
| 2010/0024549 A1* | 2/2010 | Wang .................. G01P 15/0802 73/504.14 |

(Continued)

FOREIGN PATENT DOCUMENTS

| | | |
|---|---|---|
| JP | H11-230986 A | 8/1999 |
| JP | 2010-071911 A | 4/2010 |

(Continued)

*Primary Examiner* — Natalie Huls
*Assistant Examiner* — Monica S Young
(74) *Attorney, Agent, or Firm* — Harness, Dickey & Pierce, P.L.C.

(57) ABSTRACT

A physical quantity sensor has a first movable electrode section which has a portion facing a first fixed electrode section and a second movable electrode section which has a portion facing a second fixed electrode section, and is provided with a movable mass section which is formed in a shape which encloses a first fixed electrode side fixed section, a second fixed electrode side fixed section, a first movable electrode side fixed section, and a second movable electrode side fixed section in planar view.

19 Claims, 10 Drawing Sheets

(56) References Cited

U.S. PATENT DOCUMENTS

| | | | |
|---|---|---|---|
| 2010/0072563 A1* | 3/2010 | Sato | B81B 7/007 257/415 |
| 2010/0212423 A1* | 8/2010 | Rehle | G01P 15/0802 73/504.12 |
| 2011/0056295 A1 | 3/2011 | Classen | |
| 2012/0073370 A1* | 3/2012 | Schubert | G01P 15/125 73/504.12 |
| 2013/0192371 A1 | 8/2013 | Rytkonen et al. | |
| 2014/0144235 A1 | 5/2014 | Suzuki | |
| 2016/0041194 A1 | 2/2016 | Rytkonen et al. | |
| 2016/0187371 A1 | 6/2016 | Sakai et al. | |

FOREIGN PATENT DOCUMENTS

| | | |
|---|---|---|
| JP | 2014-106083 A | 6/2014 |
| JP | 2014-115080 A | 6/2014 |
| JP | 2015-503758 A | 2/2015 |
| JP | 2015-049190 A | 3/2015 |

\* cited by examiner

Y (SECOND DIRECTION)
X (FIRST DIRECTION)

PHYSICAL QUANTITY SENSOR, ELECTRONIC DEVICE, AND MOBILE BODY

BACKGROUND

1. Technical Field

The present invention relates to a physical quantity sensor, an electronic device, and a mobile body.

2. Related Art

In recent years, a sensor has been developed that is manufactured using a silicon micro electro mechanical systems (MEMS) technique. As such a sensor, an electrostatic capacitive-type physical quantity sensor is known which has a fixed electrode that is disposed to be fixed and a movable electrode which faces the fixed electrode with an interval therebetween and is provided to be displaceable, and detects a physical quantity such as acceleration and angular velocity based on electrostatic capacity between the two electrodes (for example, refer to JP-A-2010-071911 and JP-A-10-111312).

For example, the physical quantity sensor in JP-A-2010-071911 has two fixed electrode sections and a movable electrode section which are formed separated from one silicon wafer. In the physical quantity sensor, each fixed electrode section has a support conducting section which is fixed to a substrate front surface, an electrode support section with a fixed width dimension which extends linearly from the support conducting section, and a plurality of opposing electrodes which are arranged to form a combtooth shape extending from the electrode support section. Meanwhile, the movable electrode section has two support conducting portions which are fixed to the substrate front surface, and support arm portions which extend from respective support conducting portions, a weight section which is disposed in a region interposed by two support arm sections, an elastic support section which supports the weight section with respect to each support arm section, and a plurality of movable opposing electrodes which are disposed extending from the weight section so as to face the plurality of opposing electrodes of the fixed electrode section described above.

In addition, for example, the physical quantity sensor according to JP-A-10-111312 has two mounting bars which are fixed to two anchor joining regions on the front surface of the substrate, two deflection springs which are fixed to each of the both mounting bars, one center bar which is joined to other end sections of four deflection springs, a plurality of movable electrodes which are mounted on the center bar, and a plurality of fixed electrodes which are respectively disposed facing the plurality of movable electrodes being fixed to a plurality of anchor regions on the front surface of the substrate.

In such a physical quantity sensor in the related art, the movable electrode and the fixed electrode are fixed and connected to a substrate via a plurality of connecting sections (support conducting section in JP-A-2010-071911 and anchor joining region in JP-A-10-111312), but a portion of the movable electrode (weight section in JP-A-2010-071911 and center bar in JP-A-10-111312) is positioned in planar view between two connecting sections out of the plurality of connecting sections. For this reason, in the physical quantity sensor in the related art, it is difficult to shorten a distance between the two connecting sections and when the substrate is warped accompanying temperature variance, the warping of the substrate is likely to influence the fixed electrode and the movable electrode via the connecting section to be deformed, and as a result, there is a problem in that temperature characteristics deteriorate. Here, for example, the warping of the substrate accompanying temperature variance occurs due to a linear expansion coefficient difference between the substrate and a member which is joined to the substrate (for example, a structure that includes the movable electrode and the fixed electrode, or a lid member for configuring a package which accommodates the substrate and the structure).

SUMMARY

An advantage of some aspects of the invention is to provide a physical quantity sensor with superior temperature characteristics, and provide an electronic device and a mobile body that include the physical quantity sensor.

The advantage is achieved by the aspects of the invention below.

According an aspect of the invention, there is provided a physical quantity sensor including a first fixed electrode side fixed section which has a first fixed electrode section, a second fixed electrode side fixed section which has a second fixed electrode section that is disposed lined up with the first fixed electrode section along a first direction, a first movable electrode side fixed section and a second movable electrode side fixed section which are disposed lined up along a second direction which intersects with the first direction, a movable mass section which has a first movable electrode section that has a portion facing the first fixed electrode section and a second movable electrode section that has a portion facing the second fixed electrode section and which is formed in a shape which encloses the first fixed electrode side fixed section, the second fixed electrode side fixed section, the first movable electrode side fixed section, and the second movable electrode side fixed section in planar view, a first elastic section which connects the first movable electrode side fixed section and the movable mass section such that the movable mass section is displaceable in the second direction, and a second elastic section which connects the second movable electrode side fixed section and the movable mass section such that the movable mass section is displaceable in the second direction.

According to such a physical quantity sensor, it is possible to respectively shorten a distance between the two fixed electrode side fixed sections (first fixed electrode side fixed section and second fixed electrode side fixed section) and a distance between the two movable electrode side fixed sections (first movable electrode side fixed section and second movable electrode side fixed section) by forming the movable mass section as a frame body, and disposing the two fixed electrode side fixed sections and the two movable electrode side fixed sections inside the movable mass section in planar view. For this reason, even if the substrate on which the fixed electrode side fixed section and the movable electrode side fixed section are fixed is warped accompanying temperature variance, the deformation of the fixed electrode section and movable electrode section due to the warping of the substrate is reduced, and as a result, it is possible to achieve superior temperature characteristics.

In the physical quantity sensor, it is preferable that the first movable electrode section has a plurality of first movable electrode fingers which extend along the first direction, the second movable electrode section has a plurality of second movable electrode fingers which extend along the first direction, the first fixed electrode section has a plurality of first fixed electrode fingers which extend along the first direction, and the second fixed electrode section has a plurality of second fixed electrode fingers which extend along the first direction.

Thereby, it is possible to increase electrostatic capacity change between the first fixed electrode section and the first movable electrode section and between the second fixed electrode section and the second movable electrode section accompanying displacement of the movable mass section. For this reason, it is possible to achieve the physical quantity sensor with high sensitivity.

In the physical quantity sensor, it is preferable that the first fixed electrode side fixed section has a first extending section which extends along the second direction and supports the plurality of first fixed electrode fingers, and the second fixed electrode side fixed section has a second extending section which extends along the second direction and supports the plurality of second fixed electrode fingers.

Thereby, it is possible to effectively increase the number of fixed electrode fingers and movable electrode fingers. For this reason, it is possible to further increase electrostatic capacity change between the first fixed electrode section and the first movable electrode section and between the second fixed electrode section and the second movable electrode section accompanying displacement of the movable mass section.

In the physical quantity sensor, it is preferable that the first extending section is disposed on one side in the first direction with respect to the first movable electrode side fixed section and the second movable electrode side fixed section, and the second extending section is disposed on the other side in the first direction with respect to the first movable electrode side fixed section and the second movable electrode side fixed section.

Thereby, it is possible to reduce noise by carrying out a differential calculation of a signal according to electrostatic capacity change between the first fixed electrode section and the first movable electrode section and a signal according to electrostatic capacity change between the second fixed electrode section and the second movable electrode section.

The physical quantity sensor, preferably further includes a substrate, a first fixed electrode side wiring provided on the substrate and electrically connected to the first fixed electrode fingers, and a second fixed electrode side wiring provided on the substrate and electrically connected to the second fixed electrode fingers, in which the first extending section preferably has a portion which is separated from the substrate and in planar view overlapping with the first fixed electrode side wiring, and the second extending section preferably has a portion which is separated from the substrate and in planar view overlapping with the second fixed electrode side wiring.

Thereby, since the extending section and the fixed electrode side wiring have the same potential as each other, it is possible to reduce parasitic capacitance which occurs between the substrate and each extending section with the extending section and the fixed electrode side wiring overlapping with each other in planar view. As a result, it is possible to achieve superior detection characteristics of the physical quantity sensor.

The physical quantity sensor preferably further includes a substrate and a movable electrode side wiring provided on the substrate and electrically connected respectively to the first movable electrode fingers and the second movable electrode fingers, in which respective tip end sections of the first movable electrode fingers and the second movable electrode fingers preferably overlap with the movable electrode side wiring in planar view.

Thereby, when the structure which includes the movable electrode side fixed section and the substrate are anodically bonded, since the tip end section of the movable electrode finger faces the movable electrode side wiring with the same potential as the tip end section, an electric field is reduced which is generated between the tip end section of the movable electrode finger and the substrate, and as a result, it is possible to prevent or reduce sticking of each movable electrode finger on the substrate.

The physical quantity sensor preferably further includes a substrate, and a movable electrode side wiring which is provided on the substrate, in which at least one fixed section of the first movable electrode side fixed section and the second movable electrode side fixed section preferably has a plurality of connecting sections which are connected to the substrate.

Thereby, it is possible to more stably connect the substrate and the movable electrode side fixed section. In addition, it is possible to dispose a contact section between two adjacent connecting sections. For this reason, since it is possible to dispose the contact section in the center, it is possible to more stably electrically connect the contact section and the movable electrode side fixed section.

In addition, it is possible to perform electrical contact between the structure which includes the first movable electrode side fixed section and the second movable electrode side fixed section which have the same potential as each other and the movable electrode side wiring at a plurality of locations. For this reason, it is possible to increase contact reliability.

The physical quantity sensor preferably further includes a conductive contact section which is provided in contact with both of the connecting section and the movable electrode side wiring being positioned therebetween.

Thereby, it is possible to increase reliability of electrical contact between the structure which includes the first movable electrode side fixed section and the second movable electrode side fixed section which have the same potential as each other and the movable electrode side wiring.

The physical quantity sensor preferably further includes a projecting section which is provided on a main surface of the substrate overlapping with the movable mass section in planar view.

Thereby, it is possible to regulate movement in an out-of-plane surface direction of the movable mass section using the projecting section, and as a result, it is possible to prevent or reduce sticking of the movable mass section on the substrate.

In the physical quantity sensor, it is preferable that each of the first fixed electrode side fixed section and the second fixed electrode side fixed section has a portion which is positioned between the first movable electrode side fixed section and the second movable electrode side fixed section in planar view.

Thereby, it is possible to shorten a distance between the two fixed electrode side fixed sections, and as a result, it is possible to achieve further superior temperature characteristics.

The physical quantity sensor preferably further includes a linking section which links the first movable electrode side fixed section and the second movable electrode side fixed section, and is configured by the same material as the first movable electrode side fixed section and the second movable electrode side fixed section.

Thereby, it is possible to electrically connect the two movable electrode side fixed sections via the linking section. For this reason, it is possible to reduce the occurrence of a potential difference between the first movable electrode side fixed section and the second movable electrode side fixed section, and realize stable sensor characteristics. In addition, since the linking section fixes the first movable electrode side fixed section and the second movable electrode side fixed section being configured by the same material, it is possible to collectively form the two movable electrode side fixed sections and the linking section from the same substrate.

In the physical quantity sensor, it is preferable that the first movable electrode side fixed section has a first support section which extends along the second direction, the second movable electrode side fixed section has a second support section which extends along the second direction, the first elastic section extends from the first support section, and the second elastic section extends from the second support section.

Thereby, it is possible to increase the distance between the first elastic section and the second elastic section. For this reason, it is possible to reduce the displacement in an out-of-plane surface direction of the movable mass section. For this reason, it is possible to improve impact resistance of the physical quantity sensor.

According to another aspect of the invention, there is provided an electronic device including the physical quantity sensor.

According to such an electronic device, since the physical quantity sensor has superior temperature characteristics, it is possible to increase reliability.

According to still another aspect of the invention, there is provided a mobile body including the physical quantity sensor.

According to such a mobile body, since the physical quantity sensor has superior temperature characteristics, it is possible to increase reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
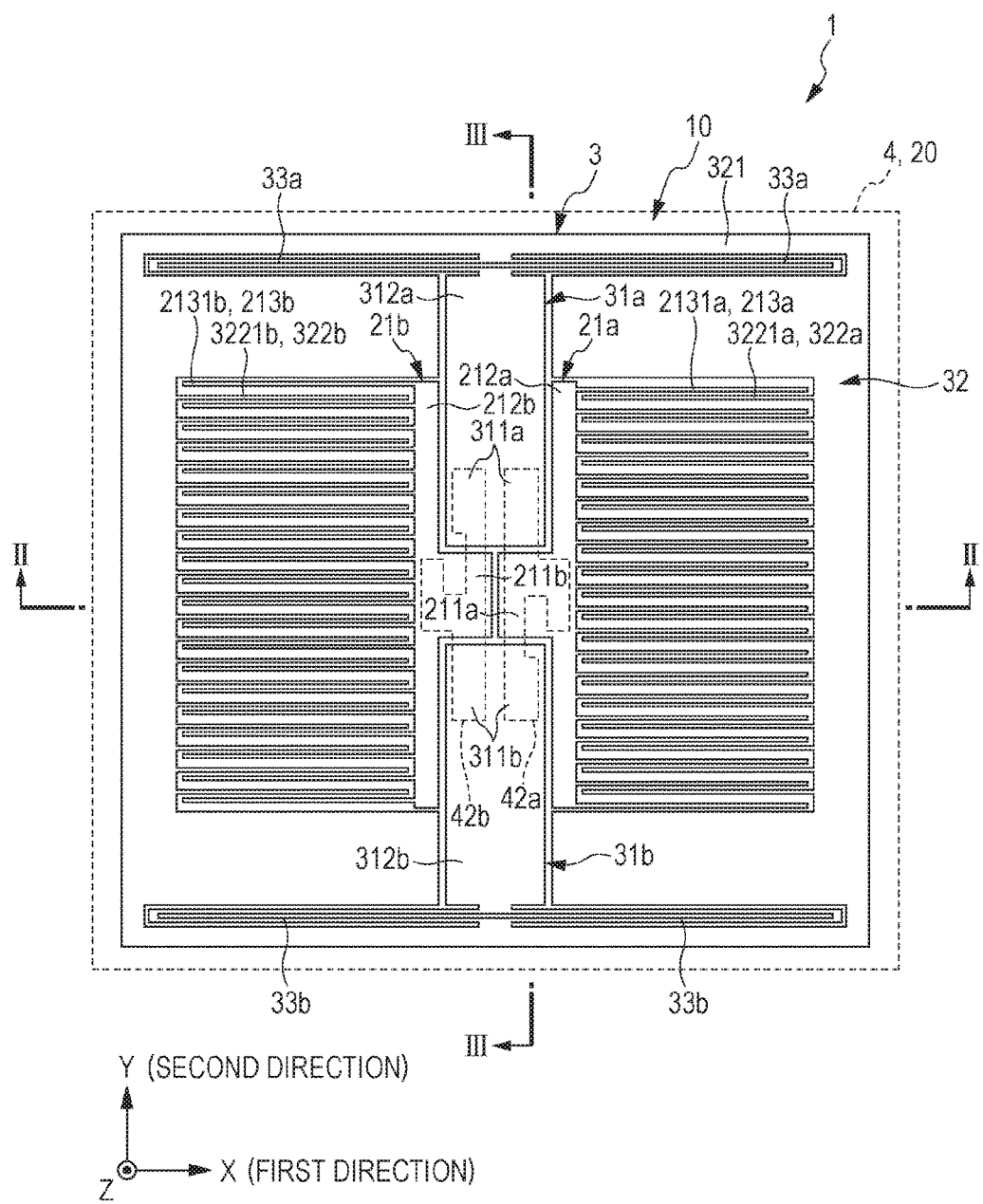
FIG. 1 is a planar view illustrating a physical quantity sensor according to a first embodiment of the invention.

A physical quantity sensor, an electronic device, and a mobile body of the invention will be described below in detail based on the embodiments which are illustrated in the drawings.

1. Physical Quantity Sensor

First, a physical quantity sensor of the invention will be described.

First Embodiment

Figure 2:
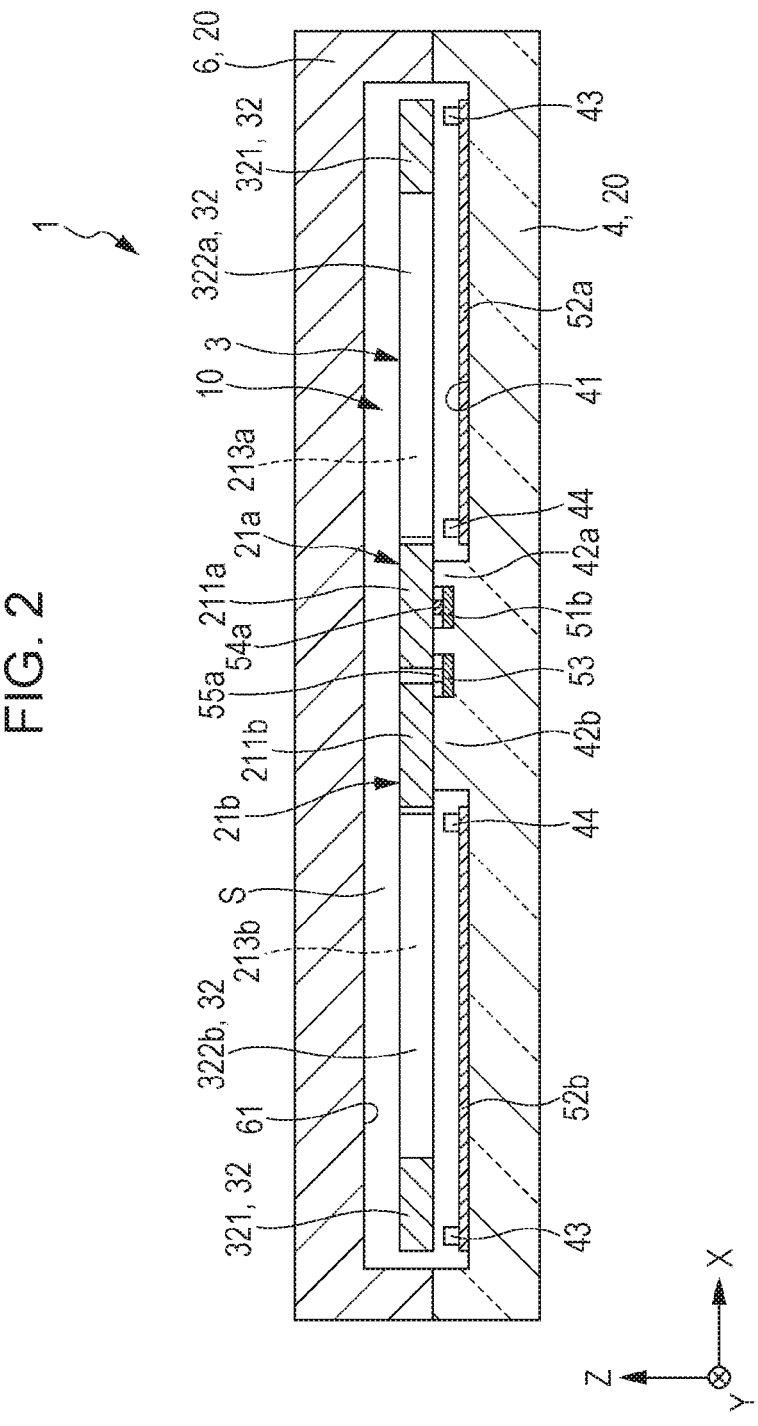
FIG. 2 is a sectional view taken along line II-II in FIG. 1.
Figure 3:
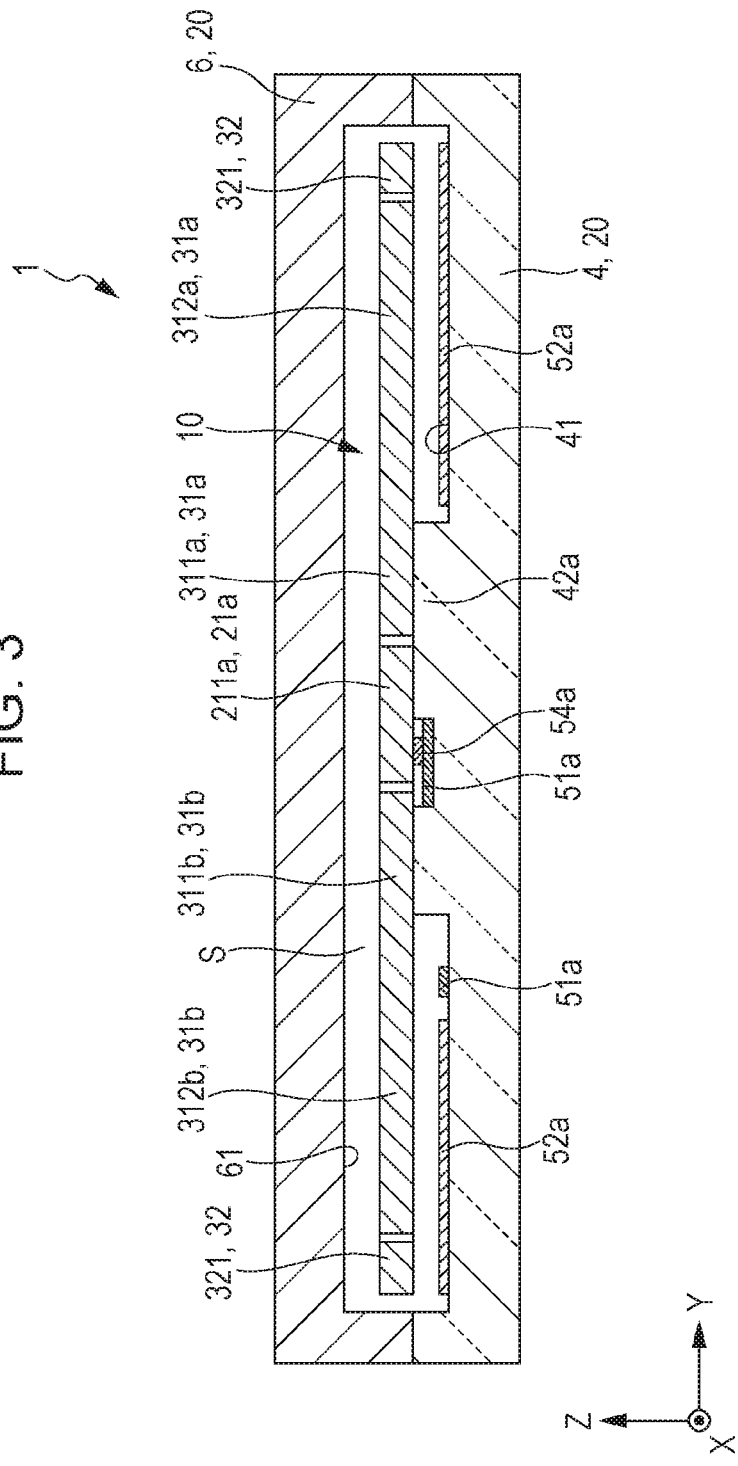
FIG. 3 is a sectional view taken along line III-III in FIG. 1.
Figure 4:
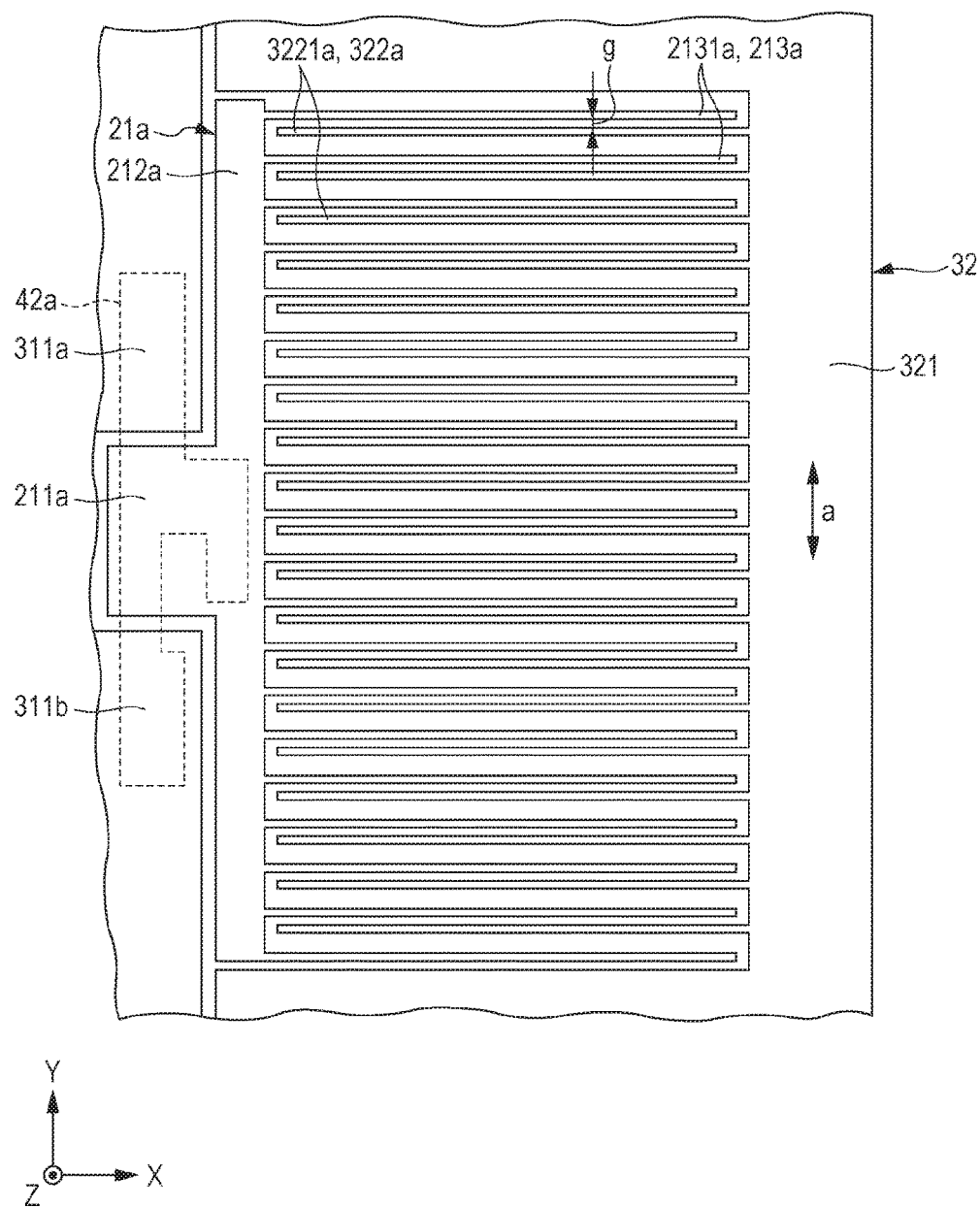
FIG. 4 is a partial expanded planar view for describing a first fixed electrode section and a first movable electrode section which are provided in the physical quantity sensor illustrated in FIG. 1.
Figure 5:
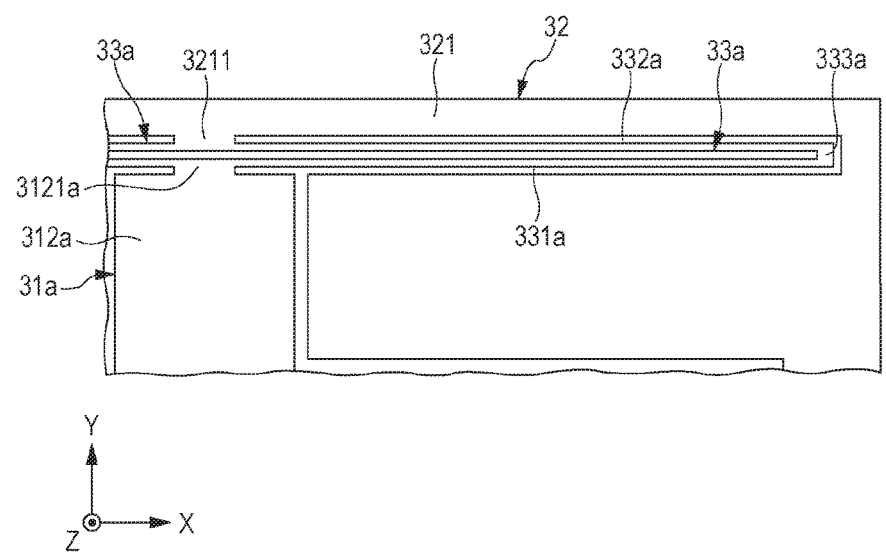
FIG. 5 is a partial expanded planar view for describing a first elastic section which are provided in the physical quantity sensor illustrated in FIG. 1.
Figure 6:
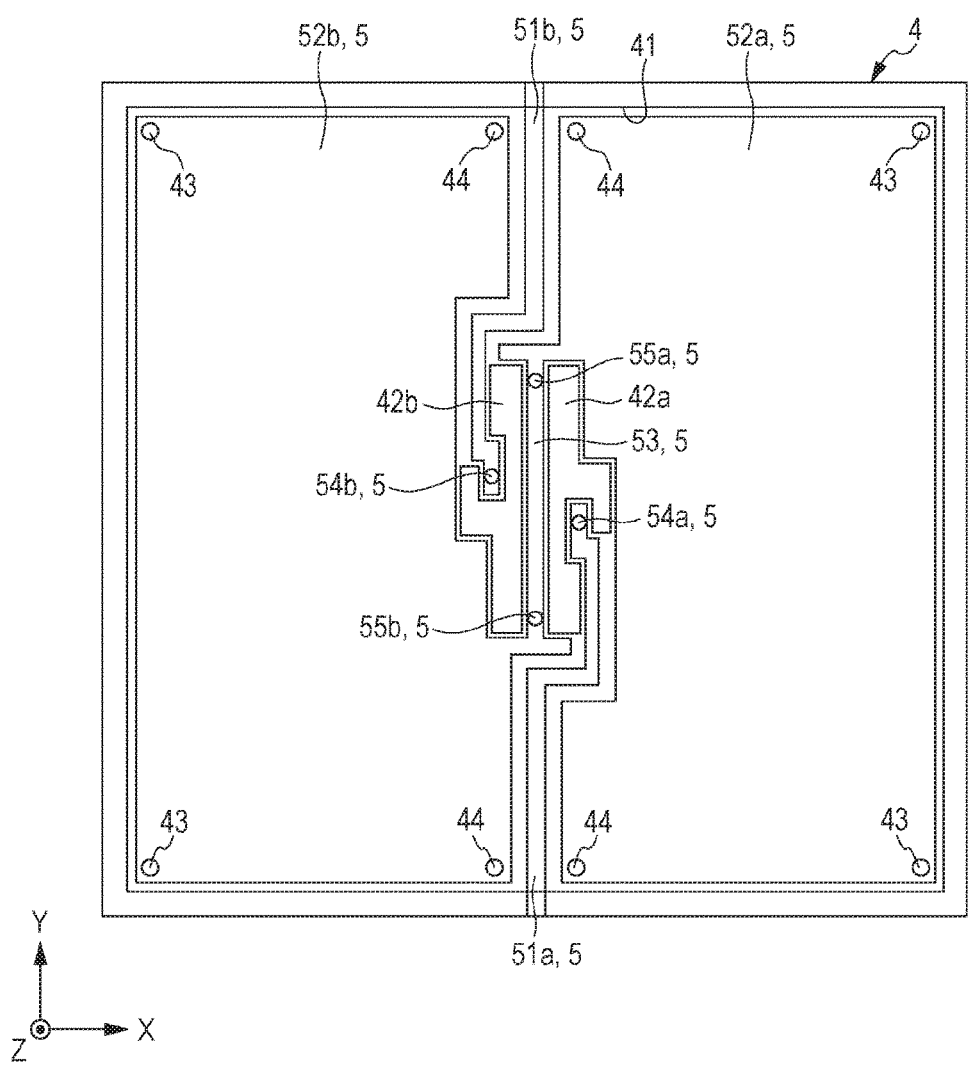
FIG. 6 is a planar view for describing a support substrate and a wiring pattern which are provided in the physical quantity sensor illustrated in FIG. 1.

FIG. 1 is a planar view illustrating a physical quantity sensor according to a first embodiment of the invention, FIG. 2 is a sectional view taken along line II-II in FIG. 1, and FIG. 3 is a sectional view along line III-III in FIG. 1. FIG. 4 is a partial expanded planar view for describing a first fixed electrode section and a first movable electrode section which is provided with the physical quantity sensor illustrated in FIG. 1. FIG. 5 is a partial expanded planar view for describing a first elastic section which is provided with the physical quantity sensor illustrated in FIG. 1. FIG. 6 is a planar view for describing a support substrate and a wiring pattern which are provided with the physical quantity sensor illustrated in FIG. 1.

Here, in each diagram, for convenience of explanation, an X axis (first axis), a Y axis (second axis), and a Z axis (third axis) which are three axes which are orthogonal to each other are illustrated as arrows, tip end sides of the arrows are set as "+ (plus)" and the base end side is set as "− (minus)". In addition, hereinafter a direction (first direction) which is parallel to the X axis is referred to as an "X axis direction", a direction (second direction) which is parallel to the Y axis is referred to as a "Y axis direction", and a direction which is parallel to the Z axis is referred to as a "Z axis direction". In addition, for convenience of explanation, hereinafter an upper side (+Z axis direction side) in FIG. 2 and FIG. 3 is set as "upper", and a lower side (−Z axis direction side) is set as "lower".

As shown in FIGS. 1 to 3, the physical quantity sensor 1 of the embodiment has a sensor element 10, a substrate 4 which supports the sensor element 10, a wiring pattern 5 which is electrically connected to the sensor element 10 on the substrate 4, and a lid member 6 which is joined to the substrate 4 so as to cover the sensor element 10. Here, the substrate 4 and the lid member 6 configure a package 20 that forms a space S that stores the sensor element 10. Each section which configures the physical quantity sensor 1 will be described below in order.

Sensor Element 10

As shown in FIG. 1, the sensor element 10 has a first fixed electrode side fixed section 21a, a second fixed electrode side fixed section 21b, a first movable electrode side fixed section 31a, and a second movable electrode side fixed section 31b which are fixed to the substrate 4, a movable mass section 32 which encloses the fixed sections in planar view, and two first elastic sections 33a and two second elastic sections 33b which are connected to the first movable electrode side fixed section 31a, the second movable electrode side fixed section 31b, and the movable mass section 32.

Here, the first movable electrode side fixed section 31a, the second movable electrode side fixed section 31b, the movable mass section 32, the two first elastic sections 33a, and two second elastic sections 33b are formed integrally to configure a movable electrode side structure 3. That is, the sensor element 10 has the first fixed electrode side fixed section 21a, the second fixed electrode side fixed section 21b, and the movable electrode side structure 3 which are disposed at intervals with a gap from each other, and the movable electrode side structure 3 has the first movable electrode side fixed section 31a, the second movable electrode side fixed section 31b, the movable mass section 32, the first elastic section 33a, and the second elastic section 33b which are integrally formed. Here, in the embodiment, the sensor element 10 has a form with rotational symmetry in planar view.

The first fixed electrode side fixed section 21a and the second fixed electrode side fixed section 21b are disposed lined up along the X axis direction. Here, the first fixed electrode side fixed section 21a is disposed on the +X axis direction side with respect to the center of the sensor element 10, and meanwhile, the second fixed electrode side fixed section 21b is disposed on the −X axis direction side with respect to the center of the sensor element 10.

The first fixed electrode side fixed section 21a has a connecting section 211a which is connected to the substrate 4, a first extending section 212a which extends from the connecting section 211a along respective directions of a +Y axis direction and a −Y axis direction and separated from the substrate 4, and a first fixed electrode section 213a which is connected to the first extending section 212a. The first fixed electrode section 213a is configured by a plurality of first fixed electrode fingers 2131a which are supported by an end in the first extending section 212a (refer to FIG. 4). The plurality of first fixed electrode fingers 2131a extend along the +X axis direction from the first extending section 212a and are disposed lined up at intervals with a gap along the Y axis direction, and configure the "first fixed electrode comb section" which has a comb-tooth shape.

In the same manner, the second fixed electrode side fixed section 21b has a connecting section 211b which is connected to the substrate 4, a second extending section 212b which extends from the connecting section 211b along respective directions of the +Y axis direction and the −Y axis direction and separated from the substrate 4, and a second fixed electrode section 213b which is connected to the second extending section 212b. The second fixed electrode section 213b is disposed lined up along the X axis direction with respect to the first fixed electrode section 213a described above, and is configured by a plurality of second fixed electrode fingers 2131b which are supported by an end on the second extending section 212b. The plurality of second fixed electrode fingers 2131b extend along the −X axis direction from the second extending section 212b and are disposed lined up at intervals with a gap along the Y axis direction, and configure the "second fixed electrode comb section" which has a comb-tooth shape.

Meanwhile, the first movable electrode side fixed section 31a and the second movable electrode side fixed section 31b are disposed lined up along the Y axis direction which intersects with the X axis direction. Here, the first movable electrode side fixed section 31a is disposed on the +Y axis direction side with respect to the center of the sensor element 10, and meanwhile, the second movable electrode side fixed section 31b is disposed on the −Y axis direction side with respect to the center of the sensor element 10. In the embodiment, in planar view, the first movable electrode side fixed section 31a is disposed on the +Y axis direction side and the second movable electrode side fixed section 31b is disposed on the −Y axis direction side with respect to the connecting sections 211a and 211b. Accordingly, the first fixed electrode side fixed section 21a and the second fixed electrode side fixed section 21b respectively have a portion (connecting sections 311a and 311b) which is positioned between the first movable electrode side fixed section 31a and the second movable electrode side fixed section 31b in planar view.

The first movable electrode side fixed section 31a has the connecting section 311a which is connected to the substrate 4 and a first support section 312a which extends from the connecting section 311a along the +Y axis direction. The end section (end section 3121a which is illustrated in FIG. 5) on the +Y axis direction side of the first support section 312a has a narrow width.

In the same manner, the second movable electrode side fixed section 31b has the connecting section 311b which is connected to the substrate 4 and a second support section 312b which extends from the connecting section 311b along the −Y axis direction. The end section on the −Y axis direction side of the second support section 312b has a narrow width.

In this manner, the first fixed electrode side fixed section 21a, the second fixed electrode side fixed section 21b, the first movable electrode side fixed section 31a, and the second movable electrode side fixed section 31b are disposed inside the movable mass section 32 which has a frame shape in planar view. In other words, in planar view, the movable mass section 32 has a shape which is enclosed by the first fixed electrode side fixed section 21a, the second fixed electrode side fixed section 21b, the first movable electrode side fixed section 31a, and the second movable electrode side fixed section 31b.

The movable mass section 32 has a frame section 321 which is a frame shape in planar view, a first movable electrode section 322a and a second movable electrode section 322b which are connected to the frame section 321.

Here, the first movable electrode section 322a has a portion which faces the first fixed electrode section 213a described above. In detail, the first movable electrode section 322a is configured by a plurality of first movable electrode fingers 3221a which are disposed extending inside the frame section 321 so as to mesh with a gap g at intervals with respect to the plurality of first fixed electrode fingers 2131a (first fixed electrode comb section) of the first fixed electrode section 213a described above and in which an end is supported on the frame section 321 (refer to FIG. 4). The plurality of first movable electrode fingers 3221a extend along the −X axis direction from the frame section 321 and are disposed lined up at intervals with a gap along the Y axis direction, and configure the "first movable electrode comb section" which has a comb-tooth shape.

In the same manner, the second movable electrode section 322b has a portion which faces the second fixed electrode section 213b described above. In detail, the second movable electrode section 322b is configured by a plurality of second movable electrode fingers 3221b which are disposed extending inside the frame section 321 so as to mesh with a gap at intervals with respect to the plurality of second fixed electrode fingers 2131b of the second fixed electrode section 213b described above and in which an end is supported on the frame section 321. The plurality of second movable electrode fingers 3221b extend along the +X axis direction from the frame section 321 and are disposed lined up at intervals with a gap along the Y axis direction, and configure the "second fixed electrode comb section" which has a comb-tooth shape.

Such a movable mass section 32 is supported via two first elastic sections 33a with respect to the first movable electrode side fixed section 31a described above, and is supported via two second elastic sections 33b with respect to the second movable electrode side fixed section 31b described above. Accordingly, in planar view, not only the first fixed electrode side fixed section 21a, the second fixed electrode side fixed section 21b, the first movable electrode side fixed section 31a, and the second movable electrode side fixed section 31b described above, but the two first elastic sections 33a and the two second elastic sections 33b are disposed inside the movable mass section 32 which is a frame shape.

Two first elastic sections 33a are respectively connected to the first movable electrode side fixed section 31a and the movable mass section 32 in which the movable mass section 32 is displaceable in the Y axis direction. In the same manner, two second elastic sections 33b are respectively connected to the second movable electrode side fixed section 31b and the movable mass section 32 in which the movable mass section 32 is displaceable in the Y axis direction.

In more detail, two first elastic sections 33a have a shape so as to respectively extend in the +Y axis direction while meandering such that approach and separation are repeated with each other in the X axis direction from the end section of the +Y axis direction side of the first extending section 212a of the first fixed electrode side fixed section 21a described above. That is, as shown in FIG. 5, each first elastic section 33a has a portion 331a (beam) which extends along the X axis direction from the end section 3121a of the +Y axis direction side of the first support section 312a, a portion 332a (beam) which extends along the X axis direction from the portion 3211 which protrudes inside the frame section 321, and a portion 333a (linking section) which links each end section of the portions 331a and 332a.

In the same manner, two second elastic sections 33b have a shape so as to respectively extend in the −Y axis direction while meandering such that approach and separation are repeated with each other in the X axis direction from the end section of the −Y axis direction side of the second support section 312b of the second fixed electrode side fixed section 21b described above.

Here, if the shape of the first elastic section 33a and the second elastic section 33b is able to displace the movable mass section 32 in the Y axis direction, the shape is not limited to the description above, for example, may be configured by one beam which extends along the X axis direction, and may be configured by three or more beams and two or more linking sections which link with the beams.

The configuration material of the first fixed electrode side fixed section 21a, the second fixed electrode side fixed section 21b, and the movable electrode side structure 3 as described above are respectively not particularly limited, but for example, it is preferable that a silicon material (such as single crystal silicon or polysilicon) to which conductivity is imparted by impurities such as phosphorus and boron being doped.

In addition, the first fixed electrode side fixed section 21a, the second fixed electrode side fixed section 21b, and the movable electrode side structure 3 are able to collectively form one substrate (for example, silicon substrate) by etching. In this case, it is possible to simply and with high precision align the thickness of each section of the sensor element 10. In addition, it is possible to process silicon with high precision by etching.

In the sensor element 10 which is configured as described above, when acceleration in the Y axis direction which is a detection axis direction is received by the sensor element 10, the movable mass section 32 is displaced in the Y axis direction accompanying elastic deformation of the first elastic section 33a and the second elastic section 33b. By doing this, a distance between the first fixed electrode fingers 2131a of the first fixed electrode section 213a and the first movable electrode fingers 3221a of the first movable electrode section 322a, and a distance between the second fixed electrode fingers 2131b of the second fixed electrode section 213b and the second movable electrode fingers 3221b of the second movable electrode section 322b are respectively changed.

Accordingly, it is possible to detect the size of acceleration which is received by the sensor element 10 based on electrostatic capacity between the distances. In the embodiment, out of a distance between the first fixed electrode fingers 2131a and the first movable electrode fingers 3221a and a distance between the second fixed electrode fingers 2131b and the second movable electrode fingers 3221b, one distance is large, and the other distance is small. For this reason, out of electrostatic capacity between the first fixed electrode fingers 2131a and the first movable electrode fingers 3221a and electrostatic capacity between the second fixed electrode fingers 2131b and the second movable electrode fingers 3221b, one electrostatic capacity is large, and the other electrostatic capacity is small. Therefore, differential calculation is carried out on a signal based on electrostatic capacity between the first fixed electrode fingers 2131a of the first fixed electrode section 213a and the first movable electrode fingers 3221a of the first movable electrode section 322a, and a signal based on electrostatic capacity between the second fixed electrode fingers 2131b of the second fixed electrode section 213b and the second movable electrode fingers 3221b of the second movable electrode section 322b. Thereby, it is possible to reduce noise by removing a signal component accompanying displacement of the movable mass section 32 outside the detection signal axis direction, and output a signal according to acceleration which is received by the sensor element 10.

Substrate

The substrate 4 (support substrate) has a plate form, and is disposed along the XY horizontal plane (reference surface) which is a horizontal plane that includes the X axis and the Y axis. As shown in FIGS. 2 and 3, a concave section 41 is provided on an upper surface (surface of a side on which the sensor element 10 is provided) of the substrate 4. The concave section 41 has a function which prevents a movable portion (portion which excludes the connecting sections 211a, 211b, 311a, and 311b described above) of the sensor element 10 coming into contact with the substrate 4. Thereby, driving of the sensor element 10 is permissible, and it is possible for the substrate 4 to support the sensor element 10.

In addition, a first projecting section 42a, a second projecting section 42b, four projecting sections 43, and four projecting sections 44 are provided which protrude from the bottom surface of the concave section 41 on the upper surface of the substrate 4.

The first projecting section 42a and the second projecting section 42b have a function which supports the sensor element 10 in a state in which the movable portion of the sensor element 10 is suspended with respect to the substrate 4.

As shown in FIG. 6, when described in detail, the first projecting section 42a and the second projecting section 42b are disposed lined up along the X axis direction. Here, the first projecting section 42a is disposed on the +X axis direction side with respect to the center of the sensor element 10, and meanwhile, the second projecting section 42b is disposed on the −X axis direction side with respect to the center of the sensor element 10. Then, the first projecting section 42a and the second projecting section 42b respectively extend along the Y axis direction.

In this manner, the connecting section 211a of the first fixed electrode side fixed section 21a described above is joined to the center in the Y axis direction of the first projecting section 42a. Meanwhile, the connecting section 211b of the second fixed electrode side fixed section 21b described above is joined to the center in the Y axis direction of the second projecting section 42b.

In addition, the connecting section 311a of the first movable electrode side fixed section 31a described above is joined to the end section in the +Y axis direction of the first projecting section 42a and the second projecting section 42b. Meanwhile, the connecting section 311b of the second movable electrode side fixed section 31b described above is joined to the end section in the −Y axis direction of the first projecting section 42a and the second projecting section 42b.

Four projecting sections 43 and four projecting sections 44 have a function of preventing sticking of a suspended portion (in particular, the movable mass section 32) of the sensor element 10 on the substrate 4.

When described in detail, in planar view, the four projecting sections 43 are disposed at positions which overlap with an outer peripheral section of the movable mass section 32 described above (in further detail, in planar view, four corner sections of the frame section 321 which has an outer shape of a square shape). Thereby, it is possible to effectively reduce sticking of the movable mass section 32 on the substrate 4.

In addition, in planar view, the four projecting sections 44 are disposed at positions which overlap with the movable mass section 32 in the vicinity of a portion (portion in which there is a large electric field during anode adjustment) in which the upper surface of the substrate 4 is exposed from the wiring pattern 5 which will be described later. Thereby, it is possible to effectively reduce sticking of the movable mass section 32 on the substrate 4.

In addition, the configuration material of the substrate 4 is not particularly limited, but it is preferable to use a substrate material which has insulation properties, in detail, it is preferable to use a quartz substrate, a sapphire substrate, and a glass substrate, and in particular, it is preferable to use a glass material (for example, borosilicate glass such as Pyrex glass (registered trademark)) which includes alkali metal ions (movable ions). Thereby, in a case where the sensor element 10 or the lid member 6 is configured of silicon as the main material, it is possible to anodically bond the sensor element 10 and the lid member 6 to the substrate 4.

Here, in the illustrations, the substrate 4 is configured by one member, but may be configured by bonding two or more members. For example, the substrate 4 may be configured by bonding together a member with a frame form and a member with a plate form.

In addition, for example, it is possible to form the substrate 4 using a photolithography method, an etching method, or the like.

Wiring Pattern

As shown in FIG. 6, the wiring pattern 5 is provided on an upper surface of the substrate 4 described above. The wiring pattern 5 has a first fixed electrode side wiring 51a which is electrically connected to the first fixed electrode side fixed section 21a described above, a second fixed electrode side wiring 51b which is electrically connected to the second fixed electrode side fixed section 21b, and movable electrode side wirings 52a, 52b, and 53 which are electrically connected to the first movable electrode side fixed section 31a and the second movable electrode side fixed section 31b.

The first fixed electrode side wiring 51a is disposed extending to the −Y axis direction side from the vicinity of the first projecting section 42a described above. A terminal section on the +Y axis direction side of the first fixed electrode side wiring 51a is connected to the first fixed electrode side fixed section 21a via the first contact section 54a. In addition, the terminal section on the +Y axis direction side of the first fixed electrode side wiring 51a is extracted externally to the package 20 and is electrically connected to an external terminal which is not shown in the drawings. In the same manner, the second fixed electrode side wiring 51b is disposed extending to a +Y axis direction side from the vicinity of the second projecting section 42b described above. A terminal section on the −Y axis direction side of the second fixed electrode side wiring 51b is connected to the second fixed electrode side fixed section 21b via the second contact section 54b. In addition, the terminal section on the +Y axis direction side of the second fixed electrode side wiring 51b is extracted externally to the package 20 and is electrically connected to the external terminal which is not shown in the drawings. Here, a portion which connects to the first contact section 54a of the first fixed electrode side fixed section 21a is able to be said to configure a section of the connecting section 211a which is connected to the substrate 4 of the first fixed electrode side fixed section 21a described above. In the same manner, a portion which connects to the second contact section 54b of the second fixed electrode side fixed section 21b is able to be said to configure a section of the connecting section 211b which is connected to the substrate 4 of the second fixed electrode side fixed section 21b described above.

In particular, the movable electrode side wiring 52a is disposed on the +X axis direction side with respect to the first projecting section 42a so as to overlap as much as possible with a portion (in particular, the movable mass section 32) on the +X axis direction side of the sensor element 10. In the same manner, in planar view, the movable electrode side wiring 52b is disposed on the −X axis direction side with respect to the second projecting section 42b so as to overlap as much as possible with a portion (in particular, the movable mass section 32) on the −X axis direction side of the sensor element 10.

The movable electrode side wiring 53 has a portion which is disposed between the first projecting section 42a and the second projecting section 42b, and is connected to the movable electrode side wiring 52a and the movable electrode side wiring 52b. Then, the movable electrode side wiring 53 is connected to the first movable electrode side fixed section 31a via a third contact section 55a, and is connected to the second movable electrode side fixed section 31b via a fourth contact section 55b. Here, a portion which connects to the third contact section 55a of the first movable electrode side fixed section 31a is able to be said to configure a section of the connecting section 311a which is connected to the substrate 4 of the first movable electrode side fixed section 31a described above. In the same manner, a portion which connects to the fourth contact section 55b of the second movable electrode side fixed section 31b is able to be said to configure a section of the connecting section 311b which is connected to the substrate of the second movable electrode side fixed section 31b described above.

The configuration material of such a wiring pattern 5 is not particularly limited as long as the configuration material has conductivity, respectively various electrode materials are used, and it is possible to use a transparent electrode material such as indium tin oxide (ITO), zinc oxide (ZnO), a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), zirconium (Zr), and a semiconductor material such as silicon (Si).

In addition, the wiring pattern 5 collectively forms a film on which a material such as described above is formed using a sputtering method and a vapor deposition method such as an evaporation method by patterning using the photolithography method, the etching method, and the like. Here, in a case where the substrate 4 is configured by a semiconductor material such as silicon, it is preferable to provide an insulation layer between the substrate 4 and the wiring pattern 5. For example, it is possible to use silicon oxide ($SiO_2$), aluminum nitride (AlN), silicon nitride (SiN), and the like as the configuration material of the insulation layer.

In addition, the respective configuration materials of each contact section are not particularly limited as long as the configuration materials have conductivity, it is possible to use various electrode materials in the same manner as the wiring pattern 5, but for example, it is preferable to use an elemental metal such as Au, Pt, Ag, Cu, and Al, or a metal of an alloy or the like which include the elemental metals. It is possible to reduce contact resistance between the wiring pattern 5 and the sensor element 10 by configuring each contact section using such metal.

Lid Member

The lid member 6 has a function which protects the sensor element 10 described above.

The lid member 6 is joined to the substrate 4 described above, and the space S is formed in which the sensor element 10 is housed within the substrate 4.

When described in detail, the lid member 6 has a plate form, and is provided with a concave section 61 on the upper surface (surface on the sensor element 10 side). The concave section 61 is formed so as to permit displacement of a movable portion of the sensor element 10.

Then, a portion further outside than the concave section 61 on the lower surface of the lid member 6 is joined to the upper surface of the substrate 4 described above. The joining method of the lid member 6 and the substrate 4 is not particularly limited, but, for example, it is possible to use a joining method which uses an adhesive, an anodic bonding method, a direct joining method, and the like.

In addition, as long as it is possible to exhibit the function as described above, the configuration material of the lid member 6 is not particularly limited, but, for example, it is possible to appropriately use a silicon material, a glass material, or the like.

According to the physical quantity sensor 1 as described above, in planar view, it is possible to respectively shorten a distance between the first fixed electrode side fixed section 21a and the second fixed electrode side fixed section 21b and a distance between the first movable electrode side fixed section 31a and the second movable electrode side fixed section 31b by framing the movable mass section 32, and disposing the two fixed electrode side fixed sections (the first fixed electrode side fixed section 21a and the second fixed electrode side fixed section 21b) and the two movable electrode side fixed sections (the first movable electrode side fixed section 31a and the second movable electrode side fixed section 31b) inside the movable mass section 32. For this reason, even if the substrate 4 is warped accompanying temperature variance, the influence of warping of the substrate 4 is received by the sensor element 10 is reduced, and as a result, it is possible to set superior temperature characteristics. Moreover, it is possible to make one distance (a distance between the first fixed electrode side fixed section 21a and the second fixed electrode side fixed section 21b in the embodiment) which is selected (for example, selected distance at which the influence of temperature characteristics is easily received) according to necessary characteristics extremely short out of the two distances described above by disposing the first fixed electrode side fixed section 21a and the second fixed electrode side fixed section 21b lined up along the X axis direction, and disposing the first movable electrode side fixed section 31a and the second movable electrode side fixed section 31b lined up along the Y axis direction which intersects with the X axis direction.

Here, for example, warping of the substrate 4 due to temperature variations occurs due to a linear expansion coefficient difference between the substrate 4 and the sensor element 10 or the lid member 6. For this reason, in a case where there is such a linear expansion coefficient difference, it is possible to cause an effect in which the temperature characteristics as described above are improved to remarkably occur.

In addition, in the physical quantity sensor 1, since each first movable electrode finger 3221a, each second movable electrode finger 3221b, each first fixed electrode finger 2131a, and each second fixed electrode finger 2131b extend along the X axis direction which is orthogonal to the detection axis direction, it is possible to increase electrostatic capacity change respectively between the first fixed electrode section 213a and the first movable electrode section 322a and between the second fixed electrode section 213b and the second movable electrode section 322b accompanying displacement of the movable mass section 32. For this reason, it is possible to design the physical quantity sensor 1 with high sensitivity.

In addition, since the first extending section 212a and the second extending section 212b respectively extend along the Y axis direction which is the detection axis direction, it is possible to effectively increase the number of each of the first movable electrode fingers 3221a, the second movable electrode fingers 3221b, the first fixed electrode fingers 2131a, and the second fixed electrode fingers 2131b. For this reason, it is possible to further increase electrostatic capacity change respectively between the first fixed electrode section 213a and the first movable electrode section 322a and between the second fixed electrode section 213b and the second movable electrode section 322b accompanying displacement of the movable mass section 32.

In addition, as described above, the first extending section 212a is disposed on one side in the X axis direction with respect to the first movable electrode side fixed section 31a and the second movable electrode side fixed section 31b, and the second extending section 212b is disposed on another side in the X axis direction with respect to the first movable electrode side fixed section 31a and the second movable electrode side fixed section 31b. Thereby, as described above, it is possible to reduce noise by carrying out a differential calculation of a signal according to electrostatic capacity change between the first fixed electrode section 213a and the first movable electrode section 322a and a signal according to electrostatic capacity change between the second fixed electrode section 213b and the second movable electrode section 322b.

In addition, in planar view, the first extending section 212a has a portion which overlaps with the first fixed electrode side wiring 51a which is electrically connected to the first fixed electrode fingers 2131a. In the same manner, in planar view, the second extending section 212b has a portion which overlaps with the second fixed electrode side wiring 51b which is electrically connected to the second fixed electrode fingers 2131b. Here, the first extending section 212a and the first fixed electrode side wiring 51a have the same potential as each other, and in addition, the second extending section 212b and the second fixed electrode side wiring 51b have the same potential as each other. For this reason, it is possible to reduce parasitic capacitance which occurs between the substrate 4 and the first extending section 212a and the second extending section 212b due to the first extending section 212a and the first fixed electrode side wiring 51a overlapping in planar view and the second extending section 212b and the second fixed electrode side wiring 51b overlapping in planar view. As a result, it is possible to set a superior detection characteristic of the physical quantity sensor 1.

In addition, in planar view, a tip end section of the first movable electrode fingers 3221a overlaps with the movable electrode side wiring 52a which is electrically connected to the first movable electrode fingers 3221a, and a tip end section of the second movable electrode fingers 3221b overlaps with the movable electrode side wiring 52b which is electrically connected to the second movable electrode fingers 3221b. Thereby, for example, when the sensor element 10 which is a structure that includes the first fixed electrode side fixed section 21a and the second fixed electrode side fixed section 21b and the substrate 4 are anodically bonded, the tip end section of the first movable electrode fingers 3221a face the movable electrode side wiring 52a with the same potential, and the tip end section of the second movable electrode fingers 3221b face the movable electrode side wiring 52b with the same potential. For this reason, during anodical bonding, a field is reduced which is generated between the tip end section of the first movable electrode fingers 3221a and the second movable electrode fingers 3221b and the substrate 4, and as a result, it is possible to prevent or reduce sticking of each first movable electrode finger 3221a and each second movable electrode finger 3221b on the substrate 4.

In addition, as described above, both of the connecting section 311a of the first movable electrode side fixed section 31a and the connecting section 311b of the second movable electrode side fixed section 31b are connected to the movable electrode side wiring 53. Thereby, it is possible to perform electrical contact between the movable electrode side structure 3 which is a structure that includes the first movable electrode side fixed section 31a and the second movable electrode side fixed section 31b that have the same potential as each other and the movable electrode side wiring 53 at a plurality of locations using the first contact section 54a and the second contact section 54b. For this reason, it is possible to increase contact reliability.

In addition, since the respective number (number of the connecting parts to the substrate 4) of the connecting section 311a and the connecting section 311b is two, it is possible to more stably connect the substrate 4 to the first movable electrode side fixed section 31a and the second movable electrode side fixed section 31b. In addition, it is possible to respectively dispose the third contact section 55a or the fourth contact section 55b between the two connecting sections 311a and between the two connecting sections 311b. That is, since it is possible to dispose the third contact section 55a and the fourth contact section 55b at the center, it is possible to more stably electrically connect the third contact section 55a or the fourth contact section 55b and the first movable electrode side fixed section 31a or the second movable electrode side fixed section 31b.

In addition, as described above, the conductive third contact section 55a is provided in contact with both the connecting section 311a and the movable electrode side wiring 53 therebetween, and the conductive fourth contact section 55b is provided in contact with both the connecting section 311b and the movable electrode side wiring 53 therebetween. Thereby, it is possible to increase reliability of electrical contact between the movable electrode side structure 3 and the movable electrode side wiring 53.

In addition, as described above, a plurality of projecting sections 43 and the plurality of projecting sections 44 are provided overlapping with the movable mass section 32 in planar view on the main surface of the substrate 4. Thereby, it is possible to regulate movement in an out-of-plane surface direction of the movable mass section 32 using the projecting sections 43 and 44, and as a result, it is possible to prevent or reduce sticking of the movable mass section 32 on the substrate 4.

In addition, as described above, the first fixed electrode side fixed section 21a and the second fixed electrode side fixed section 21b respectively have a portion which are positioned between the first movable electrode side fixed section 31a and the second movable electrode side fixed section 31b in planar view. For this reason, it is possible to shorten a distance between the two fixed electrode side fixed sections, and as a result, it is possible to set further superior temperature characteristics.

In addition, since the two first elastic sections 33a extend from the first support section 312a, and the two second elastic sections 33b extend from the second support section 312b, it is possible to increase a distance between the first elastic section 33a and the second elastic section 33b. For this reason, it is possible to reduce the displacement in an out-of-plane surface direction (Z axis direction) of the movable mass section 32. For this reason, it is possible to improve impact resistance of the physical quantity sensor 1. In addition, in detection of the physical quantity sensor 1, it is also possible to further separate frequency of a vibration detection (for example, vibration due to linear acceleration) mode according to a physical quantity that is desired to be detected and a mode for unnecessary vibration in detection (so-called mode for vibration which is noise).

Second Embodiment

Figure 7:
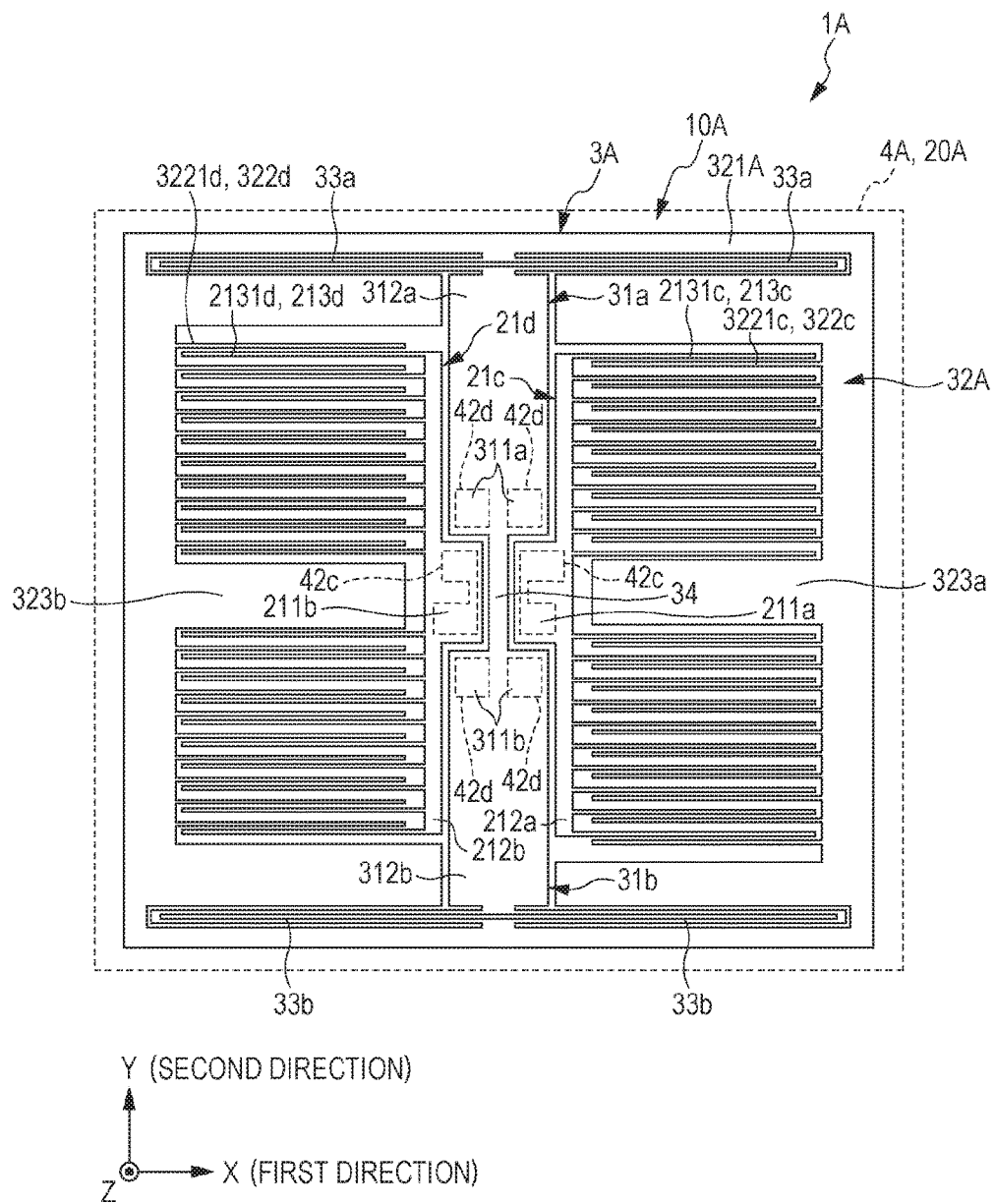
FIG. 7 is a planar view illustrating a physical quantity sensor according to a second embodiment of the invention.

FIG. 7 is a planar view illustrating the physical quantity sensor according to the second embodiment of the invention.

The physical quantity sensor according to the embodiment, is the same as the physical quantity sensor according to the first embodiment described above other than that the configuration of the respective first and second fixed electrode section and the movable electrode section is different.

Here, the description below relates to the second embodiment, the description focuses on the differences from the embodiment described above, and similar matter is omitted from the description. In addition, in FIG. 7, the configuration which is the same as the first embodiment described above is given the same reference numerals.

As shown in FIG. 7, a physical quantity sensor 1A of the embodiment has a sensor element 10A and a substrate 4A which supports the sensor element 10A. Here, the substrate 4A and the lid member (not shown in the drawings) configures a package 20A which forms a space that houses the sensor element 10A.

The sensor element 10A has a first fixed electrode side fixed section 21c and a second fixed electrode side fixed section 21d which are supported on two projecting sections 42c of the substrate 4A, and a movable electrode side structure 3A which is supported on four projecting sections 42d of the substrate 4A.

The first fixed electrode side fixed section 21c has a first fixed electrode section 213c which is connected to the first extending section 212a. The first fixed electrode section 213c extends along the +X axis direction from the first extending section 212a and has a plurality of first fixed electrode fingers 2131c which are disposed lined up at intervals with a gap along the Y axis direction, and configure the "first fixed electrode comb section" which has a comb-tooth shape.

In the same manner, the second fixed electrode side fixed section 21d has a second fixed electrode section 213d which is connected to the second extending section 212b. The second fixed electrode section 213d extends along the −X axis direction from the second extending section 212b, has a plurality of second fixed electrode fingers 2131d which are disposed lined up at intervals with a gap along the Y axis direction, and configure the "second fixed electrode comb section" which has a comb-tooth shape.

In the embodiment, the plurality of first fixed electrode fingers 2131c (first fixed electrode comb section) which has the first fixed electrode section 213c and a plurality of second fixed electrode fingers 2131d (second electrode comb section) which has a second fixed electrode section 213d are respectively divided in an electrode finger group made from a plurality of electrode fingers which are disposed at one side in the Y axis direction and an electrode finger group made from a plurality of electrode fingers which are disposed on another side, and a distance between the electrode finger group in each electrode comb section is larger than the gap between the electrode fingers in each electrode finger group.

The movable electrode side structure 3A has a linking section 34 which links the first movable electrode side fixed section 31a and the second movable electrode side fixed section 31b and a movable mass section 32A which is supported via the first elastic section 33a and the second elastic section 33b with respect to the first movable electrode side fixed section 31a and the second movable electrode side fixed section 31b.

The linking section 34 extends along the Y axis direction so as to pass between the connecting section 211a of the first fixed electrode side fixed section 21c and the connecting section 211b of the second fixed electrode side fixed section 21d in planar view, an end section on the +Y axis direction side of the linking section 34 is connected to the first movable electrode side fixed section 31a and an end section on the −Y axis direction side of the linking section 34 is connected to the second movable electrode side fixed section 31b. Here, the first movable electrode side fixed section 31a, the second movable electrode side fixed section 31b, and the linking section 34 are able to be said to configure one "movable electrode side fixed section".

In this manner, since the linking section 34 links the first movable electrode side fixed section 31a and the second movable electrode side fixed section 31b, and is configured by the same material as the first movable electrode side fixed section 31a and the second movable electrode side fixed section 31b, it is possible to electrically connect the first movable electrode side fixed section 31a and the second movable electrode side fixed section 31b via the linking section 34. For this reason, it is possible to reduce the occurrence of a potential difference between the first movable electrode side fixed section 31a and the second movable electrode side fixed section 31b, and realize stable sensor characteristics. In addition, since the linking section 34 fixes the first movable electrode side fixed section 31a and the second movable electrode side fixed section 31b using the same material, it is possible to collectively form the two movable electrode side fixed sections from the same substrate.

In planar view, the movable mass section 32A has a shape which is enclosed by the first fixed electrode side fixed section 21c, the second fixed electrode side fixed section 21d, the first movable electrode side fixed section 31a, the second movable electrode side fixed section 31b, and the linking section 34.

The movable mass section 32A has a frame section 321A which is a frame shape in planar view, a first movable electrode section 322c and a second movable electrode section 322d which are connected to the frame section 321A, and a first weight section 323a and a second weight section 323b. Here, the first movable electrode section 322c extends along the −X axis direction from the frame section 321A and has a plurality of first movable electrode fingers 3221c which is disposed lined up at intervals with a gap along the Y axis direction so as to mesh with a gap at intervals with respect to a plurality of first fixed electrode fingers 2131c (first fixed electrode comb section) of the first fixed electrode section 213c described above, and configure the "first movable electrode comb section" which has a comb-tooth shape. In the same manner, the second movable electrode section 322d extends along the +X axis direction from the frame section 321A and has a plurality of second movable electrode fingers 3221d which is disposed lined up at intervals with a gap along the Y axis direction so as to mesh with a gap at intervals with respect to a plurality of second fixed electrode fingers 2131d (second fixed electrode comb section) of the second fixed electrode section 213d described above, and configure the "second movable electrode comb section" which has a comb-tooth shape.

In the embodiment, the plurality of electrode fingers (first movable electrode comb section) which has the first movable electrode section 322c and a plurality of electrode fingers (second movable electrode comb section) which has a second movable electrode section 322d are respectively divided in an electrode finger group made from a plurality of electrode fingers which are disposed at one side in the Y axis direction and an electrode finger group made from a plurality of electrode fingers which are disposed on another side, and a distance between the electrode finger group in each electrode comb section is larger than the gap between the electrode fingers in each electrode finger group.

Then, the first weight section 323a extends along the −X axis direction from the frame section 321A so as to enter between two electrode finger groups (in more detail, between two electrode finger groups of the first fixed electrode section 213c described above) of the first movable electrode section 322c. In the same manner, the second weight section 323b extends along the +X axis direction from the frame section 321A so as to enter between two electrode finger groups (in more detail, two electrode finger groups of the second fixed electrode section 213d described above) of the second movable electrode section 322d.

Here, the distance between the first weight section 323a and one electrode finger group of the first movable electrode section 322c is equal to a distance between the electrode fingers in the electrode finger group. In the same manner, the distance between the second weight section 323b and one electrode finger group of the second movable electrode section 322d is equal to a distance between the electrode fingers in the electrode finger group. Thereby, it is possible for the first weight section 323a and the second weight section 323b respectively function as a portion of the first movable electrode section 322c and the second movable electrode section 322d.

It is possible to realize superior temperature characteristics also using the physical quantity sensor 1A according to the second embodiment as described above.

2. Electronic Device

Subsequently, an electronic device in which the physical quantity sensor 1 is used will be described in detail based on FIGS. 8 to 10.

Figure 8:
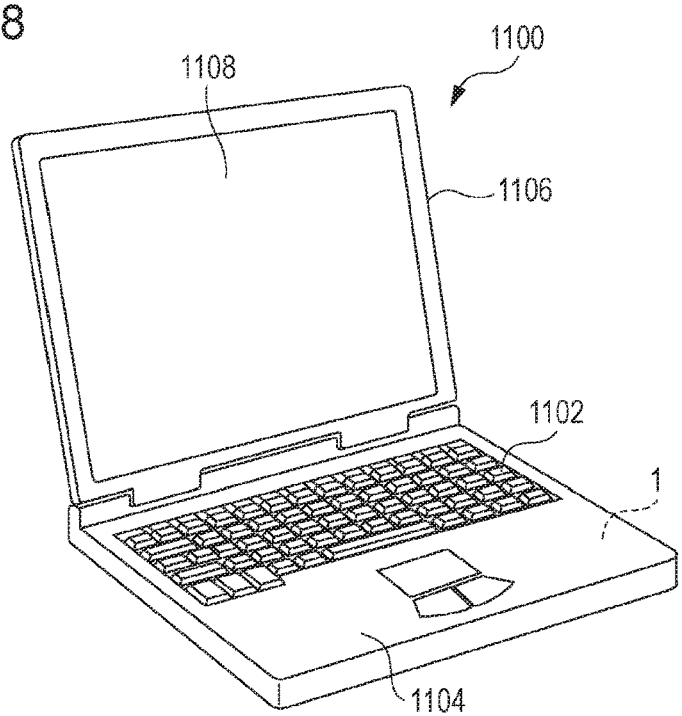
FIG. 8 is a perspective view schematically illustrating a configuration of a mobile type personal computer which is an example of an electronic device in the invention.

FIG. 8 is a perspective view schematically illustrating a configuration of a mobile type personal computer which is an example of an electronic device in the invention.

In the drawing, a personal computer 1100 is configured by a main body section 1104 which includes a keyboard 1102, and a display unit 1106 which is provided with a display section 1108, and the display unit 1106 is supported so as to be able to rotate via a hinge structure section with respect to the main body section 1104. The physical quantity sensor 1 which functions as a gyro sensor is built in to such a personal computer 1100.

Figure 9:
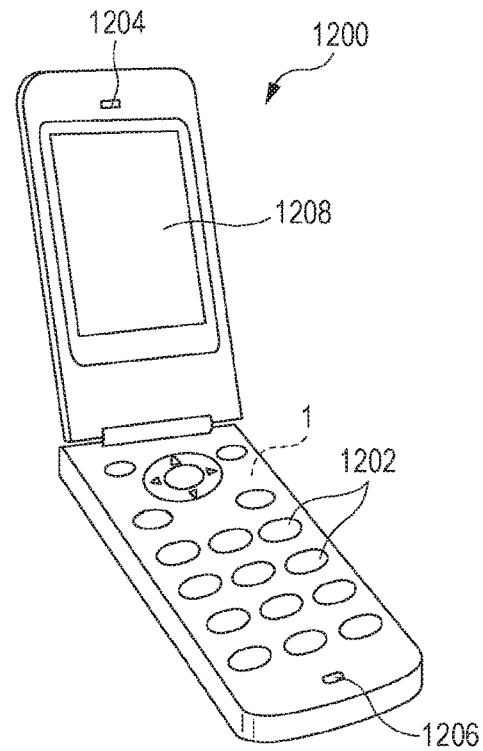
FIG. 9 is a perspective view schematically illustrating a configuration of a mobile phone which is an example of the electronic device in the invention.

FIG. 9 is a perspective view schematically illustrating a configuration of a mobile phone which is an example of the electronic device in the invention.

In the drawing, a mobile phone 1200 is provided with a plurality of operation buttons 1202, a receiving port 1204, and a transmission port 1206, and a display section 1208 is disposed between the operation buttons 1202 and the receiving port 1204. The physical quantity sensor 1 which functions as the gyro sensor is built in to such a mobile phone 1200.

Figure 10:
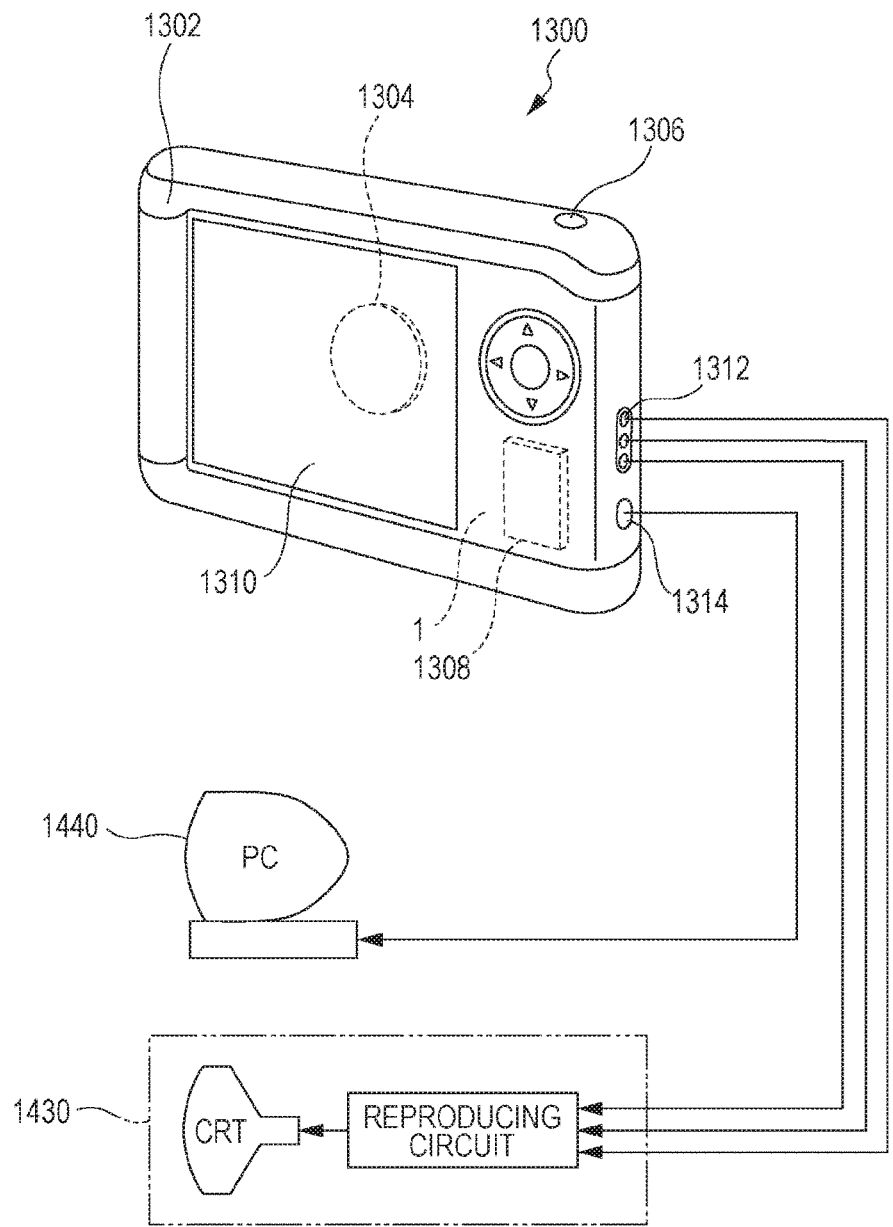
FIG. 10 is a perspective view illustrating a configuration of a digital still camera which is an example of the electronic device of the invention.

FIG. 10 is a perspective view illustrating a configuration of a digital still camera which is an example of the electronic device of the invention. Here, the drawing also illustrates the connection of an external device in a simplified manner. Here, a normal camera, with respect to photosensitizing a silver halide photographic film using an optical image of a subject, and a digital still camera 1300 generate an imaging signal (image signal) by carrying out photoelectric conversion on an optical image of a subject using an imaging element such as a charge coupled device (CCD).

The display section 1310 is provided on the rear surface of a case (body) 1302 in the digital still camera 1300, and is configured to perform display based on the imaging signal using the CCD, and the display section 1310 functions as a viewfinder which displays the subject as an electronic image.

In addition, a light-receiving unit 1304 which includes an optical lens (imaging optical system), a CCD, and the like is provided at the front surface side (the rear surface side in the drawing) of the case 1302.

A subject image which is displayed on the display section 1310 is confirmed by a photographer, and at the point in time when a shutter button 1306 is pressed down, the imaging signal of the CCD is transferred and stored in a memory 1308.

In addition, a video signal output terminal 1312 and an input and output terminal 1314 for data communication are provided on a side surface of the case 1302 in the digital still camera 1300. Then, as illustrated, a television monitor 1430 is connected to the video signal output terminal 1312, or a personal computer 1440 is connected to the input and output terminal 1314 for data communication respectively according to need. Furthermore, using a predetermined operation, the imaging signal which is stored in the memory 1308 is configured so as to be output to the television monitor 1430 or the personal computer 1440.

The physical quantity sensor 1 which functions as the gyro sensor is built in to such a digital still camera 1300.

Here, in addition to the personal computer in FIG. 8 (mobile-type personal computer), the mobile phone in FIG. 9, and the digital still camera in FIG. 10, it is also possible to apply the electronic device which is provided with the physical quantity sensor of the invention to, for example, a smartphone, a tablet terminal, a timepiece, an ink jet-type discharging apparatus (for example, an ink jet printer), a laptop-type personal computer, a television, a video camera, a video tape recorder, a car navigation device, a pager, an electronic organizer (including those having a communication function), an electronic dictionary, an electronic calculator, an electronic game device, a word processor, a work station, a video phone, a television monitor for crime prevention, a pair of electronic binoculars, a POS terminal, medical equipment (for example, an electronic thermometer, a blood pressure meter, a blood glucose meter, an electrocardiographic measuring device, an ultrasonic diagnostic device, or an electronic endoscope), a fish finder, various measurement equipment, an instrument (for example, an instrument for a vehicle, an aircraft, or a ship), a flight simulator, and the like.

3. Mobile Body

Subsequently, a mobile body in which the physical quantity sensor 1 is used will be described in detail based on FIG. 11.

Figure 11:
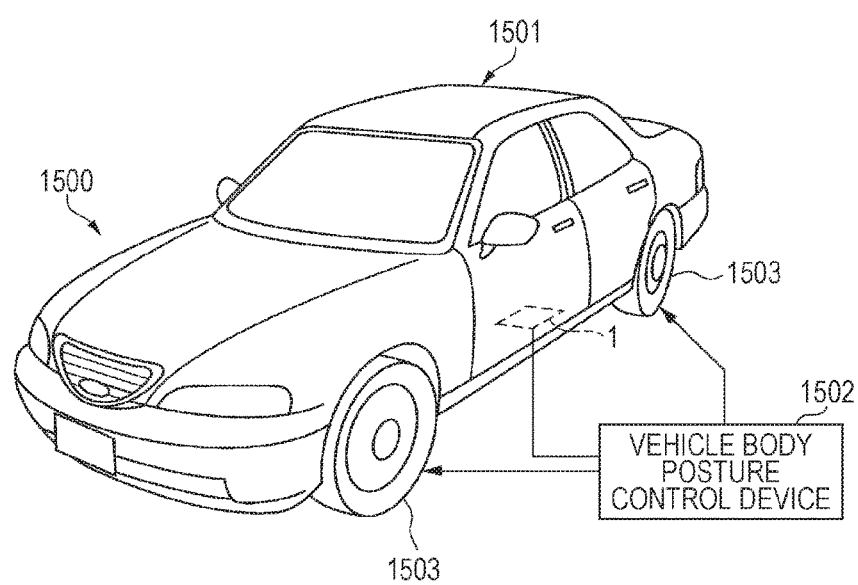
FIG. 11 is a perspective view illustrating a configuration of an automobile which is an example of a mobile body of the invention.

FIG. 11 is a perspective view illustrating a configuration of an automobile which is an example of a mobile body of the invention.

The physical quantity sensor 1 which functions as the gyro sensor is built in to an automobile 1500, and it is possible to detect the posture of a vehicle 1501 using the physical quantity sensor 1. The detection signal of the physical quantity sensor 1 is supplied to a vehicle body posture control device 1502, the vehicle body posture control device 1502 detects the posture of the vehicle 1501 based on the detection signal, and according to the detection result, it is possible to control the hardness of suspension, or control brakes of individual wheels 1503. In addition, such posture control is able to be utilized in a biped walking robot and a radio controlled helicopter. As above, posture control is realized in various mobile bodies, and the physical quantity sensor 1 is incorporated.

The physical quantity sensor, the electronic device, and the mobile body of the invention are described above based on the embodiments of the drawings, but the invention is not limited thereto, and it is possible for the configuration of each section to be substituted with an arbitrary configuration which has the same function. In addition, other arbitrary constructions may be added to the invention.

The entire disclosure of Japanese Patent Application No. 2015-138779, filed Jul. 10, 2015 is expressly incorporated by reference herein.

What is claimed is:

1. A physical quantity sensor comprising:
   a first fixed electrode side fixed section having a first fixed electrode section;

a second fixed electrode side fixed section that is disposed to directly face the first fixed electrode side fixed section in a direction along an X axis, the second fixed electrode side fixed section having a second fixed electrode section, the first and second fixed electrode sections being disposed side by side along the X axis, the X axis being one of three axes that are orthogonal to each other and include the X axis, a Y axis and a Z axis;

a first movable electrode side fixed section and a second movable electrode side fixed section which are disposed in a direction along the Y axis;

a movable mass section which has a first movable electrode section that has a portion facing the first fixed electrode section and a second movable electrode section that has a portion facing the second fixed electrode section;

a first elastic section which connects the first movable electrode side fixed section and the movable mass section along the Y axis; and a second elastic section which connects the second movable electrode side fixed section and the movable mass section along the Y axis, wherein the movable mass section surrounds the first and second fixed electrode side fixed sections and the first and second movable electrode side fixed sections when viewed in a direction along the Z axis, a length of the first elastic section along the X axis is greater than a length of the first movable electrode side fixed section along the X axis, a length of the second elastic section along the X axis is greater than a length of the second movable electrode side fixed section along the X axis, and the first and second fixed electrode side fixed sections are located between the first movable electrode side fixed section and the second movable electrode side fixed section when viewed in the direction along the Z axis.

2. The physical quantity sensor according to claim 1,
wherein the first movable electrode section has a plurality of first movable electrode fingers which extend along the X axis,
the second movable electrode section has a plurality of second movable electrode fingers which extend along the X axis,
the first fixed electrode section has a plurality of first fixed electrode fingers which extend along the X axis, and
the second fixed electrode section has a plurality of second fixed electrode fingers which extend along X axis.

3. The physical quantity sensor according to claim 2, further comprising:
a substrate; and
a movable electrode side wiring provided on the substrate and electrically connected respectively to the first movable electrode fingers and the second movable electrode fingers,
wherein tip end sections of each of the first movable electrode fingers and each of the second movable electrode fingers overlap with the movable electrode side wiring when viewed in the direction along the Z axis.

4. An electronic device comprising:
the physical quantity sensor according to claim 2.

5. The physical quantity sensor according to claim 2,
wherein the first fixed electrode side fixed section has a first extending section which extends along the Y axis, and supports the plurality of first fixed electrode fingers, and
the second fixed electrode side fixed section has a second extending section which extends along the Y axis, and supports the plurality of second fixed electrode fingers.

6. An electronic device comprising:
the physical quantity sensor according to claim 5.

7. The physical quantity sensor according to claim 5, further comprising:
a substrate; and
a movable electrode side wiring provided on the substrate and electrically connected respectively to the first movable electrode fingers and the second movable electrode fingers,
wherein tip end sections of each of the first movable electrode fingers and each of the second movable electrode fingers overlap with the movable electrode side wiring when viewed in the direction along the Z axis.

8. The physical quantity sensor according to claim 5,
wherein the first extending section is disposed on one side in the direction along the X axis with respect to the first movable electrode side fixed section and the second movable electrode side fixed section, and
the second extending section is disposed on the other side in the direction along the X axis with respect to the first movable electrode side fixed section and the second movable electrode side fixed section.

9. An electronic device comprising:
the physical quantity sensor according to claim 8.

10. The physical quantity sensor according to claim 8, further comprising:
a substrate; and
a movable electrode side wiring provided on the substrate and electrically connected respectively to the first movable electrode fingers and the second movable electrode fingers,
wherein tip end sections of each of the first movable electrode fingers and each of the second movable electrode fingers overlap with the movable electrode side wiring when viewed in the direction along the Z axis.

11. The physical quantity sensor according to claim 8, further comprising:
a substrate;
a first fixed electrode side wiring provided on the substrate and electrically connected to the first fixed electrode fingers; and
a second fixed electrode side wiring provided on the substrate and electrically connected to the second fixed electrode fingers,
wherein the first extending section has a portion which is separated from the substrate and which overlaps with the first fixed electrode side wiring when viewed in the direction along the Z axis, and
the second extending section has a portion which is separated from the substrate and which overlaps with the second fixed electrode side wiring when viewed in the direction along the Z axis.

12. The physical quantity sensor according to claim 1,
wherein the first movable electrode side fixed section has a first support section which extends along the Y axis,
the second movable electrode side fixed section has a second support section which extends along the Y axis, the first elastic section extends from the first support section, and the second elastic section extends from the second support section.

13. The physical quantity sensor according to claim 1, further comprising:

a substrate; and a movable electrode side wiring which is provided on the substrate, wherein at least one fixed section of the first movable electrode side fixed section and the second movable electrode side fixed section has a plurality of connecting sections which are connected to the substrate.

14. The physical quantity sensor according to claim 13, further comprising:

a conductive contact section which is provided in contact with both of the connecting section and the movable electrode side wiring being positioned therebetween.

15. The physical quantity sensor according to claim 13, further comprising:

a projecting section which is provided on a main surface of the substrate overlapping with the movable mass section when viewed in the direction along the Z axis.

16. The physical quantity sensor according to claim 1, further comprising:

a linking section which links the first movable electrode side fixed section and the second movable electrode side fixed section, and is configured by the same material as the first movable electrode side fixed section and the second movable electrode side fixed section.

17. The physical quantity sensor according to claim 11, further comprising:

a substrate; and a movable electrode side wiring provided on the substrate and electrically connected respectively to the first movable electrode fingers and the second movable electrode fingers, wherein tip end sections of each of the first movable electrode fingers and each of the second movable electrode fingers overlap with the movable electrode side wiring when viewed in the direction along the Z axis.

18. An electronic device comprising:

the physical quantity sensor according to claim 1.

19. A mobile body comprising:

the physical quantity sensor according to claim 1.

* * * * *